(12) United States Patent
Kelly et al.

(10) Patent No.: US 7,206,110 B2
(45) Date of Patent: Apr. 17, 2007

(54) MEMORY CELL DUAL PROTECTION

(75) Inventors: James D. Kelly, Scotts Valley, CA (US); Shoucheng Zhang, Stanford, CA (US)

(73) Assignee: Miradia Inc., Santa Clara, CA (US)

( * ) Notice: Subject to any disclaimer, the term of this patent is extended or adjusted under 35 U.S.C. 154(b) by 0 days.

(21) Appl. No.: 11/004,595

(22) Filed: Dec. 3, 2004

(65) Prior Publication Data

US 2005/0174628 A1   Aug. 11, 2005

Related U.S. Application Data (63) Continuation-in-part of application No. 10/849,364, filed on May 18, 2004, now Pat. No. 6,992,810, and a continuation-in-part of application No. 10/849,404, filed on May 18, 2004, and a continuation-in-part of application No. 10/378,056, filed on Feb. 27, 2003, now abandoned, and a continuation-in-part of application No. 10/378,041, filed on Feb. 27, 2003, now abandoned, which is a continuation-in-part of application No. 10/378,058, filed on Feb. 27, 2003, now abandoned.

(60) Provisional application No. 60/475,404, filed on Jun. 2, 2003, provisional application No. 60/390,389, filed on Jun. 19, 2002.

(51) Int. Cl.
*G02B 26/00* (2006.01)
*G02F 1/03* (2006.01)

(52) U.S. Cl. .................. 359/237; 359/245; 359/248; 359/295

(58) Field of Classification Search ........ 359/291–293, 359/237, 245, 248, 295
See application file for complete search history.

(56) References Cited

U.S. PATENT DOCUMENTS 4,229,732 A   10/1980   Hartstein et al.

(Continued)

FOREIGN PATENT DOCUMENTS

EP   1237032 A2   9/2002

OTHER PUBLICATIONS

Henley et al., "A New SOI Manufacturing Technology Using Atomic layer Cleaving." Silicon Genesis Corporation Campbell CA. pp. 1-5.

(Continued)

*Primary Examiner*—Ricky Mack
*Assistant Examiner*—Jack Dinh
(74) *Attorney, Agent, or Firm*—Townsend and Townsend and Crew LLP (57) ABSTRACT

A spatial light modulator for use in projection display applications is provided. The spatial light modulator includes a substrate including a plurality of electrically active circuits and an electrode layer electrically coupled to at least one of the plurality of electrically active circuits. In one embodiment, the electrode layer includes a semi-continuous layer with at least one optical path. The spatial light modulator also includes a shielding layer electrically isolated from the electrode layer and disposed between the substrate and the plurality of electrically active circuits and an electrical connector coupling the shielding layer to a reference potential. In a specific embodiment, the shielding layer of the spatial light modulator converts incident light energy to electrical current and routes the current back to a source. In another specific embodiment, the shielding layer converts electrical field disturbance to electrical current and routes the current back to a source.

11 Claims, 8 Drawing Sheets

U.S. PATENT DOCUMENTS

| | | | |
|---|---|---|---|
| 4,317,611 A | 3/1982 | Petersen | |
| 4,508,640 A * | 4/1985 | Kanda et al. | 252/503 |
| 4,566,935 A | 1/1986 | Hornbeck | |
| 4,615,595 A | 10/1986 | Hornbeck | |
| 5,061,049 A | 10/1991 | Hornbeck | |
| 5,172,262 A | 12/1992 | Hornbeck | |
| 5,311,360 A | 5/1994 | Bloom et al. | |
| 5,382,961 A | 1/1995 | Gale, Jr. | |
| 5,448,314 A | 9/1995 | Heimbuch et al. | |
| 5,452,024 A | 9/1995 | Sampsell | |
| 5,489,952 A | 2/1996 | Gove et al. | |
| 5,504,614 A | 4/1996 | Webb et al. | |
| 5,535,047 A | 7/1996 | Hornbeck | |
| 5,583,688 A | 12/1996 | Hornbeck | |
| 5,589,852 A | 12/1996 | Thompson et al. | |
| 5,600,363 A | 2/1997 | Anzaki et al. | |
| 5,600,383 A | 2/1997 | Hornbeck | |
| 5,661,591 A | 8/1997 | Lin et al. | |
| 5,663,749 A | 9/1997 | Farris et al. | |
| 5,742,419 A | 4/1998 | Dickensheets et al. | |
| 5,757,536 A | 5/1998 | Ricco et al. | |
| 5,818,095 A * | 10/1998 | Sampsell | 257/435 |
| 5,835,256 A | 11/1998 | Huibers | |
| 5,885,468 A | 3/1999 | Kozlowski | |
| 5,939,171 A | 8/1999 | Biebl | |
| 5,999,306 A | 12/1999 | Atobe et al. | |
| 6,038,056 A | 3/2000 | Florence et al. | |
| 6,046,840 A | 4/2000 | Huibers | |
| 6,049,317 A | 4/2000 | Thompson et al. | |
| 6,127,756 A | 10/2000 | Iwaki et al. | |
| 6,172,797 B1 | 1/2001 | Huibers | |
| 6,201,521 B1 | 3/2001 | Doherty | |
| 6,252,277 B1 | 6/2001 | Chan et al. | |
| 6,323,982 B1 | 11/2001 | Hornbeck | |
| 6,337,760 B1 | 1/2002 | Huibers et al. | |
| 6,356,378 B1 | 3/2002 | Huibers | |
| 6,386,661 B1 | 5/2002 | Woerner | |
| 6,396,619 B1 | 5/2002 | Huibers et al. | |
| 6,429,033 B1 | 8/2002 | Gee et al. | |
| 6,529,310 B1 | 3/2003 | Huibers et al. | |
| 6,538,800 B2 | 3/2003 | Huibers | |
| 6,542,653 B2 | 4/2003 | Wu et al. | |
| 6,543,286 B2 | 4/2003 | Garverick et al. | |
| 6,809,852 B2 | 10/2004 | Tao et al. | |
| 6,856,068 B2 | 2/2005 | Miller et al. | |
| 2002/0041455 A1 | 4/2002 | Sawada et al. | |
| 2002/0071166 A1 | 6/2002 | Jin et al. | |
| 2002/0071169 A1 | 6/2002 | Bowers et al. | |
| 2002/0132389 A1 | 9/2002 | Patel et al. | |
| 2003/0117686 A1 | 6/2003 | DiCarlo | |
| 2003/0207487 A1 | 11/2003 | Kubena et al. | |
| 2004/0000696 A1 | 1/2004 | Ma et al. | |
| 2004/0004753 A1 | 1/2004 | Pan | |
| 2004/0008402 A1 | 1/2004 | Patel et al. | |
| 2001/0136044 | 7/2004 | Miller et al. | |
| 2004/0125347 A1 | 7/2004 | Patel et al. | |
| 2004/0136044 A1 | 7/2004 | Miller et al. | |
| 2004/0184133 A1 | 9/2004 | Su et al. | |
| 2004/0190817 A1 | 9/2004 | Aubuchon | |
| 2005/0041277 A1 | 2/2005 | Huibers | |

OTHER PUBLICATIONS

Henley et al., "A New SOI Manufacturing Technology Using Atomic layer Cleaving." Silicon Genesis Corporation Campbell CA. pp. 1-5, no date available.

* cited by examiner

MEMORY CELL DUAL PROTECTION

CROSS-REFERENCES TO RELATED APPLICATIONS

This application is a continuation-in-part of U.S. patent application Ser. No. 10/849,364 now U.S. Pat. No. 6,992,810, entitled "High Fill Ratio Reflective Spatial Light Modulator with Hidden Hinge" and Ser. No. 10/849,404, entitled "Fabrication of a High Fill Ratio Reflective Spatial Light Modulator with Hidden Hinge," both of which were filed on May 18, 2004 and both of which claim priority from U.S. Provisional Application Ser. No. 60/475,404, entitled "Hidden Hinge High Fill Ration Reflective Spatial Light Modulator," filed Jun. 2, 2003, and are continuations-in-part of U.S. application Ser. No. 10/378,056 now abandoned, entitled "Reflective Spatial Light Modulator," Ser. No. 10/378,041 now abandoned, entitled "Fabrication of a Reflective Spatial Light Modulator," and Ser. No. 10/378,058 now abandoned, entitled "Architecture of a Reflective Spatial Light Modulator," all filed Feb. 27, 2003 and all claiming priority from U.S. Provisional Application Ser. No. 60/390,389, entitled "Reflective Spatial Light Modulator," filed Jun. 19, 2002. The disclosures of these applications, in their entirety, are incorporated by reference herein for all purposes.

BACKGROUND OF THE INVENTION

Field of the Invention

This invention relates generally to semiconductor spatial light modulators. More particularly, embodiments according to the present invention relate to protecting memory cells from the effects of incident light and large electrical field disturbances.

Reflective spatial light modulators (SLMs) are devices that modulate light in a spatial pattern to reflect an image corresponding to an electrical or optical output. The incident light may be modulated in phase, intensity, polarization, or deflection direction. A reflective SLM is typically comprised of an area or two-dimensional array of addressable picture elements (pixels) capable of reflecting incident light. Source pixel data is first processed by an associated control circuit, and then loaded into the pixel array, one frame at a time.

Memory arrays that are dynamic random access memory (DRAM)-based are susceptible to interference from electromagnetic radiation from incident light. Thus, spatial light modulators that rely on semiconductor material for their addressing and memory circuitry can develop electron-hole pairs in the semiconductor material causing leakage currents. This effect occurs because light incident on semiconductor material generates photocarriers and alters the amount of charge present in DRAM capacitor nodes. This alteration in turn may disrupt the correct actuation of the MEMS-based pixel mirror device.

In addition, regardless of the means of storing voltage at the pixel memory sites, the actuation of MEMS devices requires bias voltage switching that is many times larger than the supply voltage of the memory array itself. The switching produces an extremely hostile electrical noise environment with potentially disruptive effects on the proper operation of the memory array if left unprotected from such noise.

Prior art SLMs have attempted to address this problem in ways that have various drawbacks. One such method, described in U.S. Pat. No. 5,818,095, reduces photocarrier generation by patterning a layer of light-blocking metal to fit the spatial light modulator's structure. This method contains a two region metal layer that covers most of the substrate. However, the metal layer contains gaps between its two regions through which incident light can enter. Although the metal layer blocks incident light from directly impinging upon the substrate, light coming through the gaps is susceptible to diffractive effects and thus this design allows a significant amount of radiation to pass through the openings between the two regions of the metal layer to the substrate.

A more serious problem with this prior art method is that it worsens the electric noise environment. The two regions of the blocking metal layer are electrically disconnected, with one region connected to the addressing electrode, and the other connected to the landing electrodes. The digital micro-mirrors make direct contact with the landing electrodes, thus the landing electrodes and therefore one region of the blocking metal layer must be maintained at the same potential as the bias voltage. Rapid switching of the bias voltage causes the same voltage swing in this region of the blocking metal layer. As the blocking metal layer is close in proximity to the active transistor region, the electric noise environment is significantly worsened.

Other conventional solutions to the problem of incident light impacting device operation have included using a static random access memory (SRAM)-based display instead. However, SRAM provides a more complex, lower yield memory array that is more difficult to scale down to smaller pixel sizes. This in turn translates into a yield reduction compared to DRAM due to a larger die size, and higher manufacturing costs.

Thus, there is a need in the art for methods and apparatus for protecting memory cells from the effects of incident light and large electrical field disturbances.

SUMMARY OF THE INVENTION

The present invention relates to a process and apparatus for protecting memory cells from the effects of both incident light and electrical noise. Embodiments in accordance with the present invention provide multiple types of protection using a single layer with a dual purpose. A layer of the device made up of metal normally used for chip-level signal routing is used as a dedicated ground plane shaped to approximate the cell.

Digital micro-mirrors operate under the extreme environment of high photon flux. Without any protection, an incident photon can hit the silicon substrate and create an electron-hole pair. The subsequent diffusion of the photo-generated electrons and holes into the active transistor region changes the charge state of the DRAM cell and degrades its stability.

The presence of a metallic ground plane significantly attenuates the intensity of the incident light. When incident light bombards the ground plane, the ground plane acts as a conductor. As long as the conductor has a thickness greater than the skin depth ($\delta$), defined as the length over which light intensity attenuates to $1/e$ of its value ($e \approx 2.718$), a portion of the photon energy is converted into the kinetic energy of the metallic electrons, which in turn dissipates into heat, with a negligible amount of the photon energy passing through the conductor.

Unlike conventional devices, the ground plane utilized in one embodiment of the present invention is not connected to any of the electrodes. As a result, the ground plane is not affected by the bias switching of the micro-mirrors. In addition, the shielding currents in the ground plane protect the SLM from the electrical field disturbance induced by the switching mirror bias voltage. The current is then returned to the source of the switching bias voltage. Conservation of charge requires such a return current, however, without the use of a ground plane as the path of least resistance, the return current would traverse the memory array itself, disrupting its operation or destroying it entirely. Thus, embodiments of the present invention allow for the return current to traverse the ground plane instead, and the current is safely routed out of the chip.

The present invention employs a DRAM-based approach, which employs a higher yield memory array that more easily scales down to smaller pixel sizes. The smaller size translates into an intrinsic yield enhancement over SRAM-based approaches. Ultimately, this approach provides significant cost savings over SRAM-based approaches.

DESCRIPTION OF SPECIFIC EMBODIMENTS

System Architecture

Figure 1A:
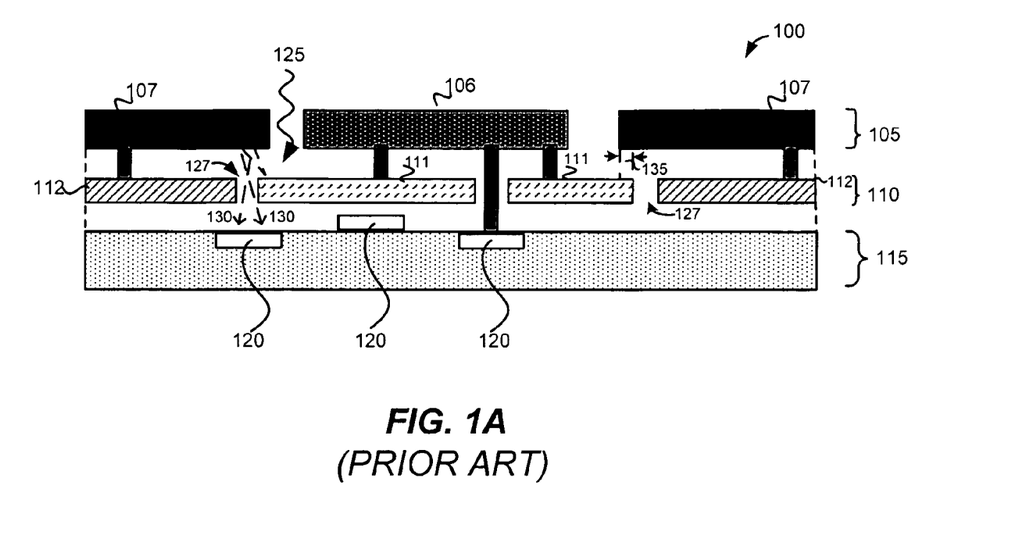
FIG. 1A is a cross-sectional view of a conventional spatial light modulator.

Referring now to FIG. 1A, there is shown a cross-sectional view of a conventional spatial light modulator (SLM) 100. The SLM 100 includes an electrode layer 105, with an addressing electrode 106 and landing electrodes 107, a two-region light blocking layer 110, with regions 111 electrically connected to the addressing electrode 106 and regions 112 electrically connected to the landing electrodes 107, and a device layer 115 with electrically active regions 120, such as a source, gate, and drain. Referring now also to the top plan view of the conventional two-region light-blocking layer 110 of FIG. 1B, it is comprised of metal or another opaque material and is designed to block incident light 125 from impinging on the device layer 115. However, gaps 127 between the regions of the layer 110 allow some light to pass through. As incident light 125 hits the light-blocking layer 110, light 125 is blocked from impinging directly in the device layer 115. However, the effects of diffraction and refection as light 125 passes through the upper layers 105, 110 allow a significant amount of light 130 to reach the device layer 115.

Figure 1B:
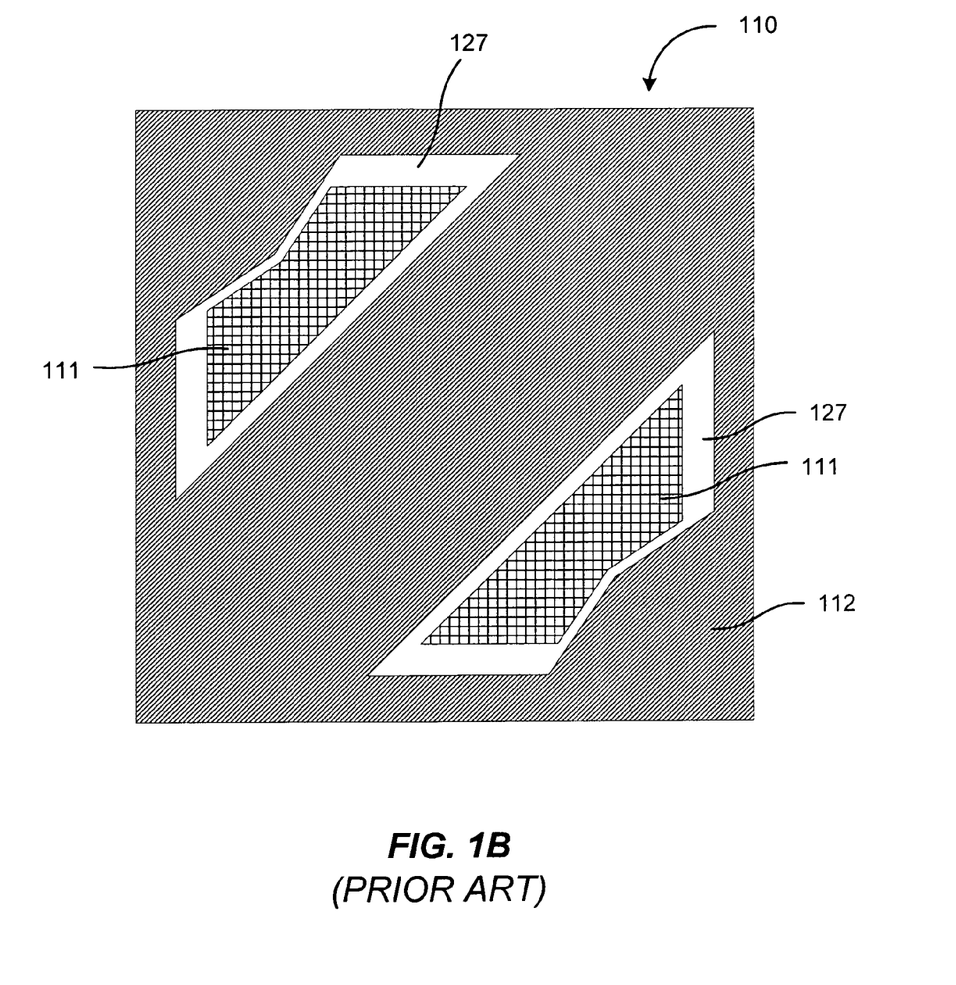
FIG. 1B is a top plan view of a light-blocking layer of a conventional spatial light modulator.

A second, and more serious, problem with the two region light-blocking layer 110 is that it provides no protection from, and may even worsen, the electric noise environment in the device 100. As the landing electrodes 107 make direct contact with the digital micro-mirrors, they must be maintained at the same bias-voltage potential, which switches with high frequency. The electrical connections between regions 112 of the light blocking layer 110 and landing electrodes 107 brings the electric field disturbance caused by the swinging bias voltage into much closer proximity with the active transistor region, potentially worsening the noise environment of the DRAM cells. In addition, in the areas where the electrode layer 105 and light-blocking layer 110 overlap and are at different potentials, such as the overlap 135 between the landing electrode 107 and light blocking region 111, there also is a risk of pinhole defects.

Figure 2:
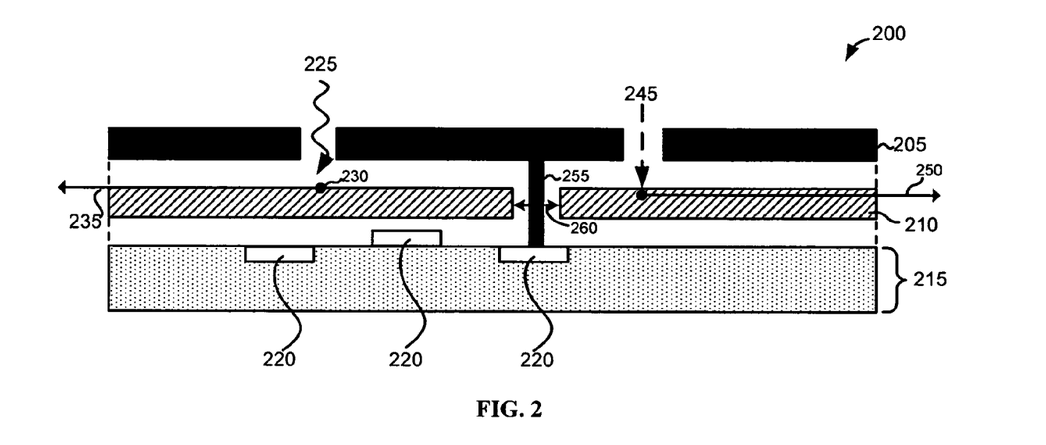
FIG. 2 is cross-sectional view a semiconductor device with a metal layer ground plane according to one embodiment of the present invention.

Referring now to FIG. 2, there is shown a semiconductor device 200 with a ground plane 210 according to one embodiment of the present invention. In an exemplary embodiment, the ground plane 210 is the metal 3 layer. Although in the embodiment described herein the device 200 is a spatial light modulator, the present invention is not limited to this application. The device 200 includes an electrode layer 205, the ground plane 210, and a device layer 215 with electrically active regions 220. Although some embodiments in accordance with the present invention employ a ground plane 210, this is not required by the present invention. In alternative embodiments, region 210 is electrically coupled to a reference potential. In one specific embodiment, the reference potential is a system ground. In another specific embodiment, the reference potential is a voltage higher than ground or alternatively, a voltage lower than ground. In other embodiments, region 210 is electrically coupled to an equipotential current return path. Connections 255 connect the electrode layer 205 to the device layer 215. According to one embodiment of the present invention, the ground plane 210 is a metal layer devoted to the dual purpose of blocking light and acting as a dedicated ground plane.

In one embodiment, the ground plane 210 thickness is at least as much as the skin depth, defined as the length over which the light intensity attenuates to 1/e of its value (e≈2.718). The skin depth (δ) is the natural constant given by the formula $\delta = (c^2/2\pi\sigma\omega)^{1/2}$, in which c is the speed of light, σ is the conductivity of the metal and ω is the frequency of the incident light. For visible frequencies, the skin depth of aluminum is approximately 30 Å. Other metals have comparable skin depths on the order of several nanometers. In an exemplary embodiment, the thickness of the metal layer is approximately 6,400 Å. The ground plane 210 defines small openings 260 to allow connections 255 to pass through, but not contact, the ground plane 210. In one embodiment, connections 255 are tightly confined by openings 260 to minimize or eliminate spaces through which light could pass to lower layers. Note that the location of connections 255 and their close confinement by openings 260 reduces the amount of light reaching layers below the ground plane 210.

The ground plane 210 is electrically isolated from the electrodes in the electrode layer 205 and acts to shield electric disturbances caused by the swinging bias voltage of the mirrors. As incident light 225 impinges on the device 200 through openings in the electrode layer 205, light 225 strikes the ground plane 210, for example at contact point 230 as shown. In some embodiments of the present invention, the ground plane 210 is fabricated as a nearly continuous layer of metal, with limited openings through which the light 225 can pass through to the device layer 215. In a specific embodiment, optically opaque insulating layers surround the connections 255 and fill the openings 260, thereby forming a continuous solid structure in the plane of the ground plane 210 that entirely prevents light from passing through the plane of the ground plane while enabling electrical connections to pass through this plane.

It will be appreciated that in other embodiments, the ground plane 210 is designed to allow electrodes to pass through the ground plane while reducing the amount of incident light passing through the ground plane and impinging on layers below the ground plane. Thus, in some embodiments, the ground plane 210 is not continuous or homogeneous, and may include additional structures to reduce the intensity of light passing through to the layers below the ground plane while enabling electrical connections to pass through the ground plane. As illustrated in FIG. 2, the location of connections 255 and the dimensions of the openings 260 are selected to nearly eliminate incident light 225 from reaching layer 215. In a particular embodiment, the intensity of light impinging on the upper surface of device layer 215 is less than or equal to the level at which leakage currents do not adversely impact system performance.

In one embodiment, the ground plane 210 is surrounded by and electrically connected to a ground bus in the form of a rectangular ring around the edge of the chip. The ground bus in turn is electrically connected to ground pins on upper and lower portions of the chip. Thus, as light 225 hits a contact point 230, it is translated into electrical current 235 and is safely routed out of the device 200. Likewise, electrical field disturbance 245 from the switching mirror bias is shielded by the ground plane 210, and the shielding current 250 is routed back to the source of the switching bias voltage via the ground bus. Without the ground plane 210 as the path of least resistance, the return current required by conservation of charge would traverse the memory array itself, disrupting its operation or destroying it entirely. The ground plane 210 blocks incident light 225 and routes electrical current 250 caused by bias switching disturbances 245 safely out of the chip. Thus, the ground plane 210 provides protection from incident light and electrical field disturbances using a single ground plane 210 layer.

Figure 3A:
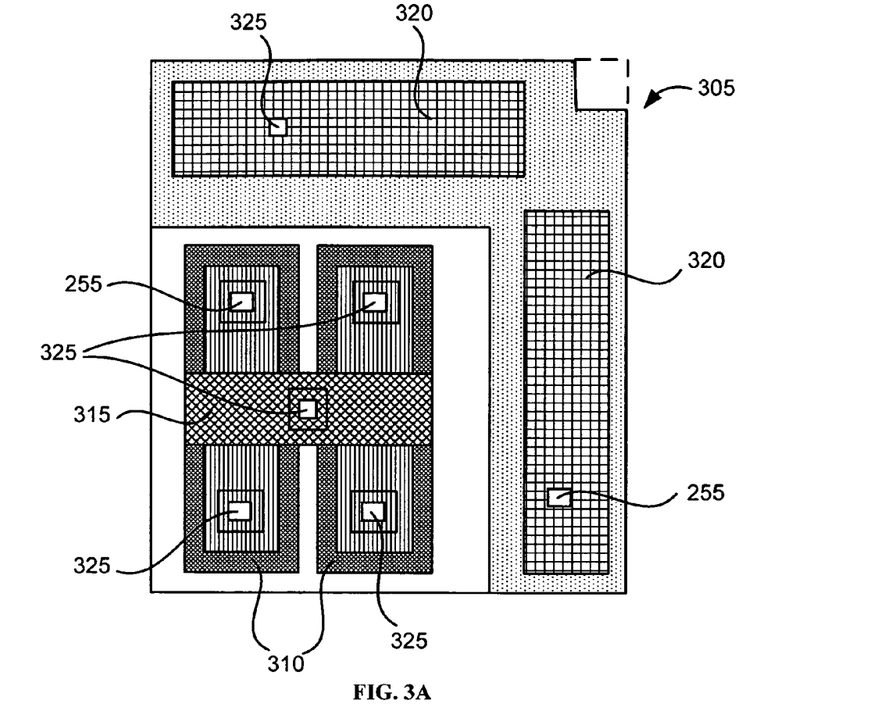
FIGS. 3A–3E are top plan views illustrating the various layers of the semiconductor device according to one embodiment of the present invention.
Figure 3B:
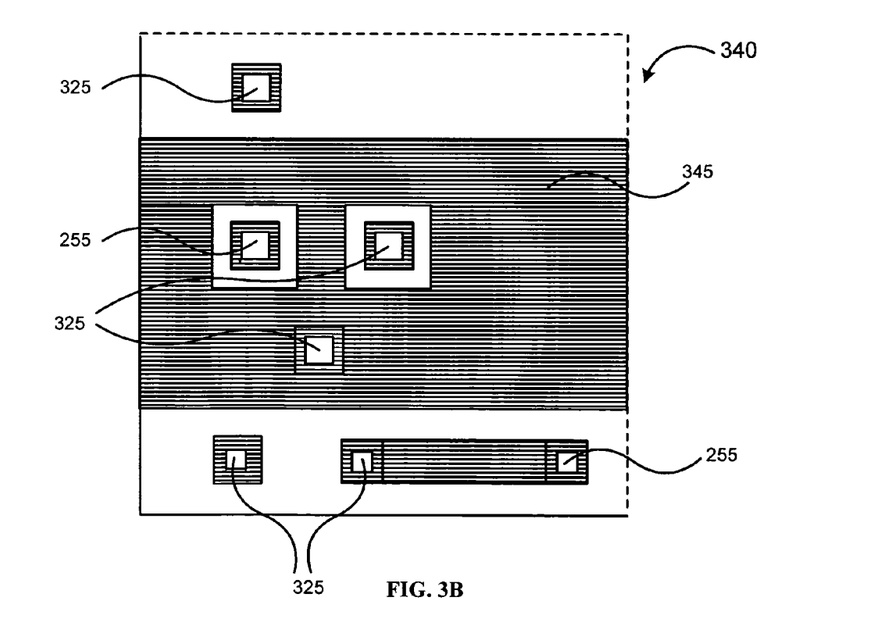
Figure 3C:
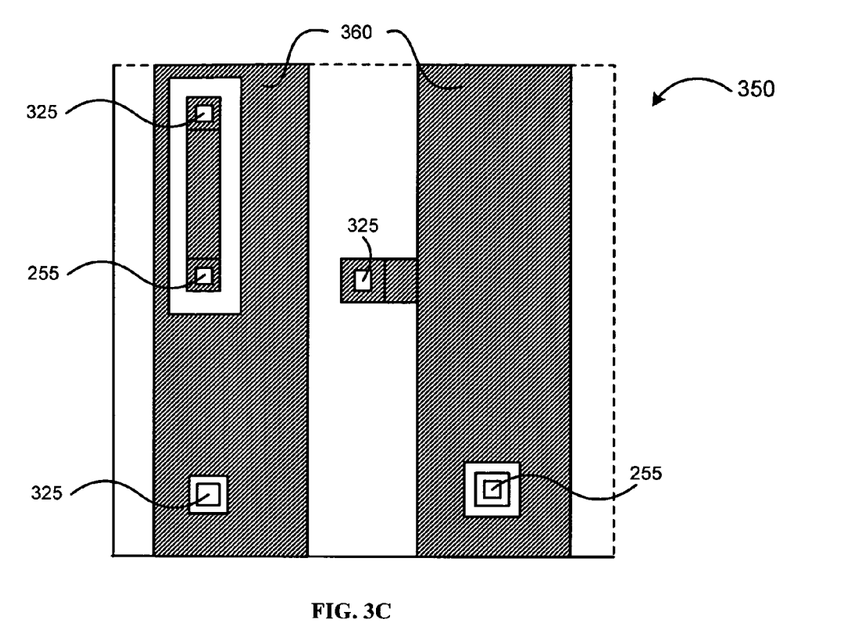

Referring now to FIGS. 3A–3E, there are shown the various layers of the spatial light modulation device 200 according to one embodiment of the present invention. FIGS. 3A–3C show the layers that make up device layer 215 of FIG. 2. FIG. 3A shows the diffused layers of the bitcell 305. The bitcell 305 includes two negative-channel metal-oxide semiconductor (NMOS) devices 310 that share a common gate 315 and two capacitors 320. Contacts 325 from the bitcell 305 to metal layer 1 (340) and contacts 255 up to the electrode layer 205 also are shown.

Referring now to FIG. 3B, it shows metal layer 1 (340), which lays one layer above the bitcell 305. Metal layer 1 (340) primarily comprises the wordline 345, which travels horizontally through the array. Metal layer 1 (340) also includes contacts 325 from the bitcell layer 305 to metal layer 1 (340) and from metal layer 1 (340) to the metal layer 2 (350), as well as contacts 255 that connect up to the electrode layer 205.

Referring now to FIG. 3C, it shows metal layer 2 (350), which lays one layer above metal layer 1 (340). Metal layer 2 (350) primarily comprises complimentary bitlines 360, which travel vertically through the array. Metal layer 2 (350) also includes connections 325 from metal layer 1 (340) to metal layer 2 (350) and connections 255 from metal layer 1 (340) to the electrode layer 205.

Figure 3D:
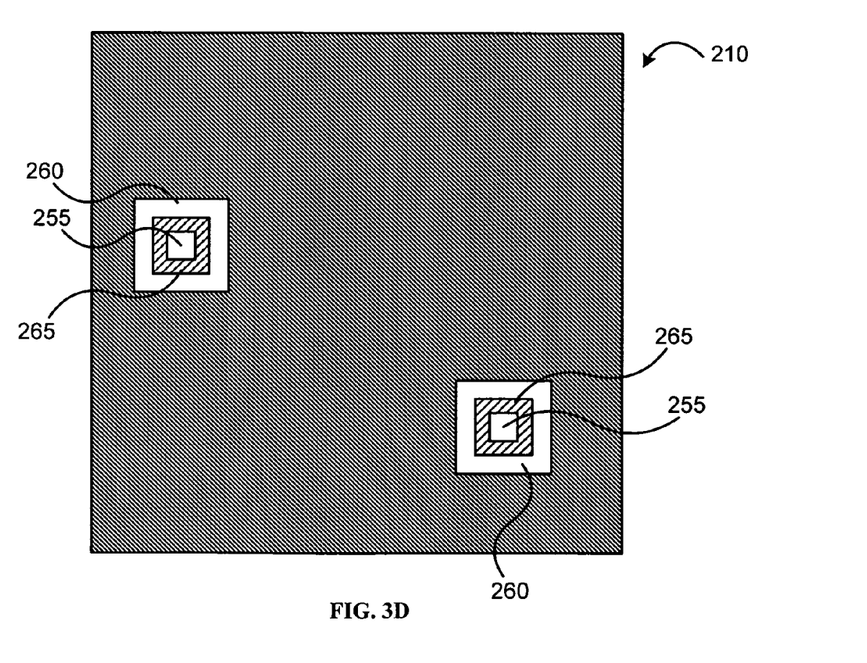

Referring now to FIG. 3D, it shows the ground plane 210, which lays one layer above metal layer 2 (350). The ground plane 210 acts as a dual protection layer, blocking light and serving as a dedicated ground plane, as described in conjunction with FIG. 2. Notice that the ground plane 210 spans nearly the entire area of the device 200, blocking almost all light from getting through to the circuitry. The ground plane 210 includes openings 260 for connections 255 spanning from metal 1 (340) to the electrode layer 205. In one embodiment, connections 255 are tightly confined by openings 260 to minimize or prevent light from reaching layers below the ground plane 210. In other embodiments, insulating layers 265 are formed surrounding connections 255. Insulating layers 265 partially fill openings 260 in some embodiments, as illustrated in FIG. 3D and partially fill openings 260 in other embodiments, thereby entirely preventing light from reaching layers below the ground plane 210. Moreover, as discussed in relation to FIG. 2, the placement of connections 255 and openings 260, and particularly their relationship to open areas present in the electrode layer 205 are selected to reduce the amount of light reaching layers below the ground plane 210.

Figure 3E:
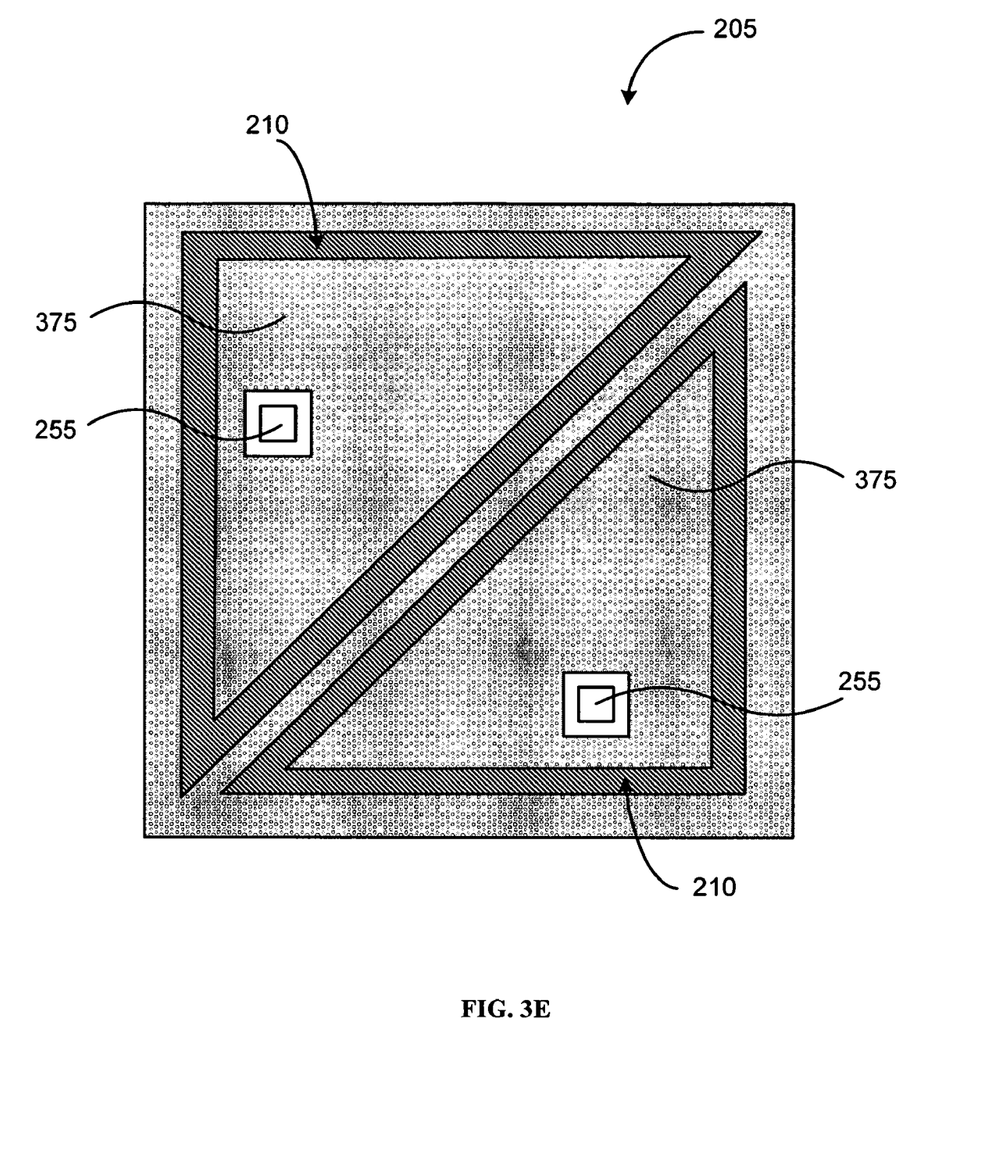

Referring now to FIG. 3E, it shows the electrode layer 205, which lays one layer above the ground plane 210. The electrode layer 205 includes electrodes 375 and connections 255 from electrode layer 205 to metal layer 1 (340). Portions of the ground plane 210 can be seen through the openings in metal layer 4 (205).

Figure 4:
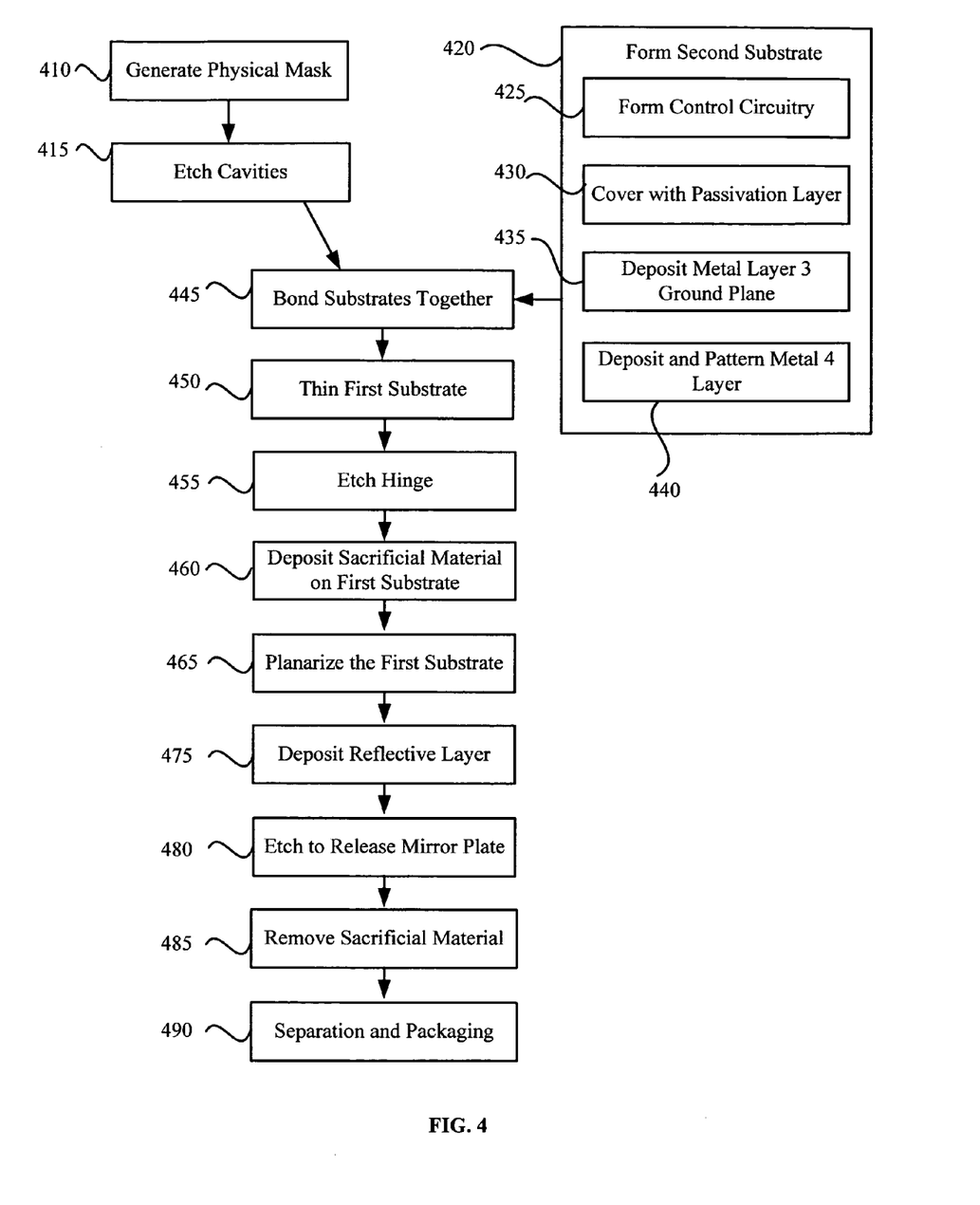
FIG. 4 is a flowchart illustrating the steps of manufacturing the various layers of the semiconductor device according to one embodiment of the present invention.

FIG. 4 is a flowchart illustrating the steps for manufacturing a spatial light modulation device 200 according to one embodiment of the present invention. Initially, a mask is generated 410 to partially fabricate the micro-mirrors of the device 200 on a first substrate. The mask defines the area to be etched 415 from one side of the first substrate to form the cavities on the underside of the micro-mirror array to define support frames and walls.

Standard techniques, such as photolithography, can be used to generate 410 the mask on the first substrate. Various etching 415 techniques may be used, as described in co-pending U.S. patent application Ser. No. 10/849,404, filed May 18, 2004, which is incorporated herein by reference.

Separately from the fabrication of the cavities in the first substrate, some or all of the electrodes 375, ground plane 210, and control circuitry 305, 340, 350 are formed 420 on a first side of a second substrate. First, the control circuitry 305, 340, 350 is formed 425, for example, using standard CMOS fabrication technology. In one embodiment, the control circuitry 305, 340, 350 includes an array of memory cells, row address circuitry, and column data loading circuitry. There are many different methods to make electrical circuitry that performs the addressing function. The DRAM, SRAM, and latch devices commonly known may all perform the addressing function. The control circuitry 305, 340, 350 is then covered 430 with a passivation layer such as silicon oxide or silicon nitride. Next, a metal layer 210 with a thickness greater than the skin depth of the metal is deposited 435, which will serve as the ground plane 210, as shown in FIG. 3D. Then, another metal layer 205 is deposited and patterned and etched 440 to define electrodes 375, as shown in FIG. 3E. The electrodes 375 are placed during fabrication so that one or more of the electrodes corresponds to each micro-mirror of the device 200. As with the first substrate, typically multiple sets of circuitry to be used in multiple spatial light modulation devices 200 are formed on the second substrate to be separated later. There are many possible alternate embodiments to the fabrication of the second substrate.

The first substrate is then bonded 445 to the second substrate, with the side of the first substrate with the cavities bonded to the electrode 375 side of the second substrate. The substrates are aligned so that the electrodes 375 on the second substrate are in the proper position to control the deflection of the micro-mirrors of the device 200. In one embodiment, the two substrates are optically aligned using double focusing microscopes by aligning a pattern on the first substrate with a pattern on the second substrate, and the two substrates and are bonded 445 together by low temperature, covalent bonding methods. The bonding 445 ensures a good mechanical adhesion between the first substrate and the second substrate and may occur at room temperature.

Next, the first substrate is thinned 450 to a pre-determined desired thickness. In one embodiment, a handling substrate is removed, typically by grinding and/or etching, and then the oxide layer is stripped away using any technique known in the art for performing oxide stripping. The oxide layer serves as a stop marker for the thinning step 450 and is placed within the first substrate to produce a thinned first substrate of desired thickness. The thinning process may involve grinding and/or etching, preferably a silicon back etch process such as wet etch or plasma etch. The result is an upper surface of the first substrate that will ultimately form the upper surface of the mirror plates of the device 200. In one embodiment, the final thickness of the resulting first substrate is several microns.

Next, a hinge is etched 455. In one embodiment, the etch uses a two-step etch process. First, the upper surface of the first substrate is etched to form a recess. This ensures that the hinge to be formed in the recess is positioned substantially below the upper surface of the first substrate, which will be the upper surface of the mirror plate at the end of the fabrication process. Second, the first substrate is etched again to substantially release the hinge from the mirror plate portion of the first substrate. The ends of the hinge remain connected to the spacer support walls and frame. A sacrificial material, such as photoresist, is then deposited 460 onto the first substrate, by spinning it onto the substrate.

The first substrate is then planarized 465 using either an etch back step, a chemical mechanical processing ("CMP") process, or any other process known in the art. This process ensures that sacrificial material is only left on and around the hinge, but not on the upper surface of the first substrate. A reflective surface is deposited 475 onto the planarized surface to create a reflective surface. In one embodiment, the reflective surface is aluminum and has thickness of 300 Å or less.

The reflective surface and the mirror plate portion are then etched 480 to release the mirror plate. The final step is to remove 485 the remaining sacrificial material on and around the hinge. In one embodiment, the sacrificial material is a photoresist material that is etched away in an $O_2$ plasma chamber. Each device 200 is then separated and packaged 490 using standard packaging techniques.

Figure 5:
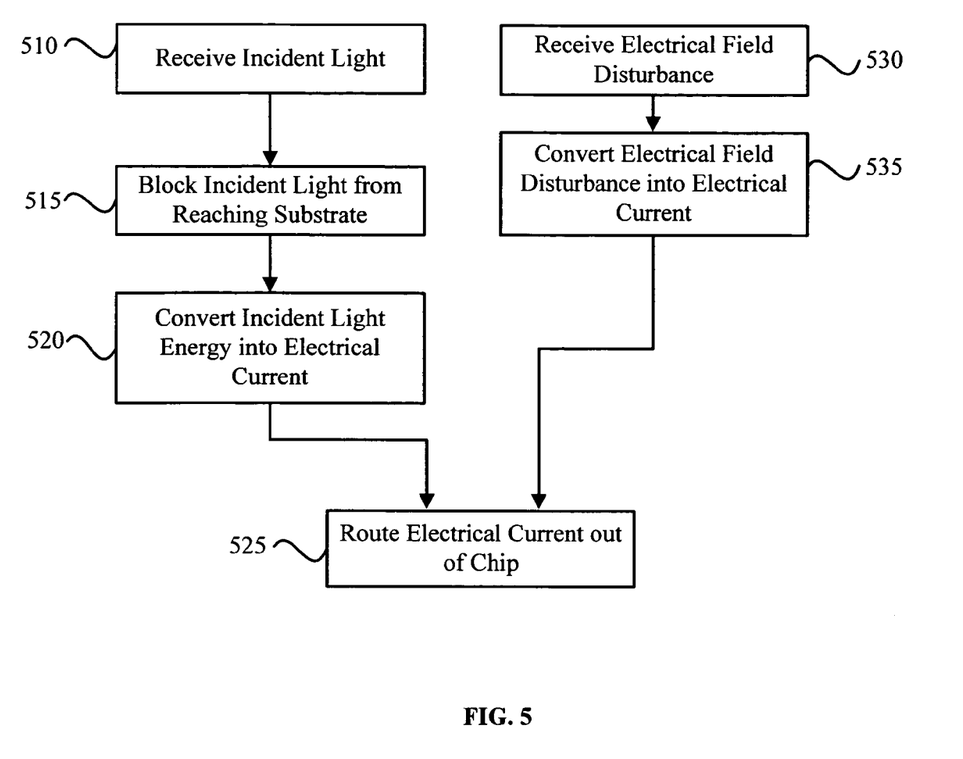
FIG. 5 is a flowchart illustrating steps in a method of dual protection of memory cells according to one embodiment of the present invention

Referring now to FIG. 5, there is shown a flowchart illustrating a method of dual protection of memory cells according to one embodiment of the present invention. In operation, the ground plane 210 receives 510 light incident on the device 200. For devices 200 requiring that medium to high intensity light be focused on the device 200, light 225 comes through gaps in the electrode layer 205. If the incident light 225 reached the device layer 215 as with conventional devices, excessive photocarrier generation would occur. Thus, in one embodiment, the ground plane 210 blocks 515 the incident light 225 from reaching the device layer 215. When incident light bombards a conductor with a thickness significantly greater than the skin depth of the conductor, the photon energy is converted directly into electrical current, with practically no part of the photon energy passing through the conductor. Thus, in embodiments of the present invention, the ground plane 210 is designed to convert 520 nearly all the incident light 225 energy into electrical current. Then, the ground plane 210 routes 525 the electrical current 235 safely out of the chip.

The ground plane 210 also receives 530 electrical field disturbance from the bias switching of the device. The hostile noise environment caused by bias switching for actuation of MEMS devices, if left unchecked, may adversely impact operation of the memory array. Thus, the ground plane 210 converts 535 the electrical field disturbance 245 into electrical current. Like the electrical current discussed in conjunction with the incident light above, the electrical current 250 is routed 525 safely out of the chip. Conservation of charge requires this return current, and the use of the ground plane 210 as the path of least resistance prevents the return current from traversing the memory array.

Finally, it should be noted that the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the following claims.

What is claimed is:

1. A spatial light modulator for use in projection display applications, the spatial light modulator comprising:
   a substrate comprising a plurality of electrically active circuits;
   an electrode layer electrically coupled to at least one of the plurality of electrically active circuits, wherein the electrode layer comprises a semi-continuous layer including at least one optical path;
   an electrically conductive shielding layer electrically isolated from the electrode layer and disposed between the plurality of electrically active circuits and the electrode layer; and
   an electrical connector coupling the electrically conductive shielding layer to a reference potential.

2. The spatial light modulator of claim 1 wherein the electrically conductive shielding layer converts an incident light energy to an electrical current and routes the electrical current back to a source.

3. The spatial light modulator of claim 1 wherein the electrically conductive shielding layer converts an electrical field disturbance to an electrical current and routes the electrical current back to a source.

4. The spatial light modulator of claim 1 wherein the electrically conductive shielding layer has a thickness greater than a skin depth of the electrically conductive shielding layer.

5. The spatial light modulator of claim 1 wherein the electrically conductive shielding layer is coupled to a ground bus for routing an electrical current out of the spatial light modulator.

6. The spatial light modulator of claim 5 wherein the ground bus is an equipotential current return path.

7. The spatial light modulator of claim 1 wherein the electrode layer comprises a plurality of addressing electrodes.

8. The spatial light modulator of claim 7 wherein the electrically conductive shielding layer is electrically isolated from the plurality of addressing electrodes.

9. The spatial light modulator of claim 1 wherein the substrate is formed using CMOS processing technology.

10. The spatial light modulator of claim 1 wherein the electrically conductive shielding layer defines small openings to allow one or more electrical connections to pass through, but not make electrical contact with the electrically conductive shielding layer.

11. The spatial light modulator of claim 1 wherein the electrically conductive shielding layer comprises an aluminum layer.

* * * * *